United States Patent
Kono

(10) Patent No.: US 11,355,589 B2
(45) Date of Patent: Jun. 7, 2022

(54) SEMICONDUCTOR DEVICE

(71) Applicant: DENSO CORPORATION, Kariya (JP)

(72) Inventor: Kenji Kono, Kariya (JP)

(73) Assignee: DENSO CORPORATION, Kariya (JP)

(\*) Notice: Subject to any disclaimer, the term of this patent is extended or adjusted under 35 U.S.C. 154(b) by 14 days.

(21) Appl. No.: 16/695,753

(22) Filed: Nov. 26, 2019

(65) Prior Publication Data

US 2020/0098935 A1  Mar. 26, 2020

Related U.S. Application Data

(63) Continuation of application No. PCT/JP2018/028142, filed on Jul. 26, 2018.

(30) Foreign Application Priority Data

Jul. 26, 2017 (JP) .............................. JP2017-144726
Jun. 20, 2018 (JP) .............................. JP2018-117316

(51) Int. Cl.
  *H01L 29/06* (2006.01)
  *H01L 29/10* (2006.01)
  (Continued)

(52) U.S. Cl.
  CPC .... *H01L 29/1066* (2013.01); *H01L 21/02529* (2013.01); *H01L 21/0465* (2013.01); *H01L 29/063* (2013.01); *H01L 29/0696* (2013.01); *H01L 29/0843* (2013.01); *H01L 29/1058* (2013.01); *H01L 29/1095* (2013.01); *H01L 29/1608* (2013.01); *H01L 29/66068* (2013.01); *H01L 29/8083* (2013.01)

(58) Field of Classification Search
  CPC ............. H01L 29/8083; H01L 29/1608; H01L 29/063; H01L 29/0696; H01L 29/0843; H01L 29/66068; H01L 29/1066; H01L 29/1095; H01L 21/02529; H01L 21/0465; H01L 29/1058; H01L 29/0623; H01L 29/0661; H01L 29/0619; H01L 29/7722; H01L 29/66909; H01L 29/808; H01L 29/0692; H01L 27/098; H01L 29/7397; H01L 29/7802; H01L 29/66712; H01L 29/7392

See application file for complete search history.

(56) References Cited

U.S. PATENT DOCUMENTS 5,945,701 A  8/1999  Siergiej et al.
6,870,189 B1  3/2005  Harada et al.
(Continued)

FOREIGN PATENT DOCUMENTS

JP  2005005385 A  *  1/2005  ....... H01L 29/41766
JP  2013-222933 A  10/2013
JP  2014-220434 A  11/2014

*Primary Examiner* — Shouxiang Hu
(74) *Attorney, Agent, or Firm* — Posz Law Group, PLC

(57) ABSTRACT

A semiconductor device with a junction type FET includes: a drift layer; a channel layer on the drift layer; a source layer in a surface portion of the channel layer; a gate layer in the channel layer; a body layer in the channel layer; a drain layer disposed on an opposite side of the source layer with respect to the drift layer; a gate wiring electrically connected to the gate layer; a first electrode electrically connected to the source layer and the body layer; and a second electrode electrically connected to the drain layer.

20 Claims, 13 Drawing Sheets

(51) Int. Cl.
    *H01L 29/808*     (2006.01)
    *H01L 29/16*     (2006.01)
    *H01L 29/08*     (2006.01)
    *H01L 29/66*     (2006.01)
    *H01L 21/02*     (2006.01)
    *H01L 21/04*     (2006.01)

(56) References Cited

U.S. PATENT DOCUMENTS

| | | |
|---|---|---|
| 7,279,368 B2 | 10/2007 | Harris et al. |
| 9,209,318 B2 * | 12/2015 | Esteve ................ H01L 29/8083 |
| 9,711,660 B2 * | 7/2017 | Konrath ................ H01L 21/266 |
| 10,381,445 B2 * | 8/2019 | Hiyoshi .............. H01L 29/7813 |
| 10,734,375 B2 * | 8/2020 | Kono .................. H01L 29/0834 |
| 2002/0190258 A1 | 12/2002 | Harada et al. |
| 2005/0056872 A1 | 3/2005 | Harada et al. |
| 2005/0127396 A1 | 6/2005 | Mitra et al. |
| 2007/0241338 A1 | 10/2007 | Yamamoto et al. |
| 2007/0252178 A1 | 11/2007 | Onose |
| 2009/0278137 A1 | 11/2009 | Sheridan et al. |
| 2009/0278177 A1 | 11/2009 | Sankin et al. |
| 2011/0217829 A1 | 9/2011 | Sankin et al. |
| 2014/0231883 A1 | 8/2014 | Esteve et al. |
| 2014/0346528 A1 | 11/2014 | Hisada et al. |
| 2016/0035904 A1 | 2/2016 | Hisada et al. |
| 2016/0064534 A1 | 3/2016 | Esteve et al. |
| 2019/0393314 A1 * | 12/2019 | Georgescu .......... H01L 29/7813 |

\* cited by examiner

US 11,355,589 B2

SEMICONDUCTOR DEVICE

CROSS REFERENCE TO RELATED APPLICATIONS

The present application is a continuation application of International Patent Application No. PCT/JP2018/028142 filed on Jul. 26, 2018, which designated the U.S. and claims the benefit of priority from Japanese Patent Applications No. 2017-144726 filed on Jul. 26, 2017 and No. 2018-117316 filed on Jun. 20, 2018. The entire disclosures of all of the above applications are incorporated herein by reference.

TECHNICAL FIELD

The present disclosure relates to a semiconductor device in which a junction-type FET (Field Effect Transistor: hereinafter, also referred to as a JFET) is formed.

BACKGROUND

Conventionally, a semiconductor device in which a JFET is formed has been proposed. Specifically, such a semiconductor device has a semiconductor substrate in which an N$^+$ type drain layer, an N$^-$ type drift layer, and an N type channel layer are sequentially stacked. In the surface portion of the channel layer, an N$^+$ type source layer is formed. In the channel layer, a P$^+$ type gate layer and a P$^+$ type body layer are formed to be apart from each other so as to penetrate the source layer. The gate layer and the body layer have the same width, the same depth, and the same impurity concentration. That is, the gate layer and the body layer have the same structure.

Further, on one surface of the semiconductor substrate on the channel layer side, a gate wiring electrically connected to the gate layer is formed, and an upper electrode electrically connected to the source layer and the body layer is also formed. The upper electrode is formed on most of the one surface of the semiconductor substrate and is sufficiently larger than the gate wiring. A lower electrode electrically connected to the drain layer is formed on the other surface of the semiconductor substrate opposite to the one surface.

SUMMARY

According to an example embodiment, a semiconductor device with a junction type FET includes: a drift layer; a channel layer on the drift layer; a source layer in a surface portion of the channel layer; a gate layer in the channel layer; a body layer in the channel layer; a drain layer disposed on an opposite side of the source layer with respect to the drift layer; a gate wiring electrically connected to the gate layer; a first electrode electrically connected to the source layer and the body layer; and a second electrode electrically connected to the drain layer.

DETAILED DESCRIPTION

Figure 1:
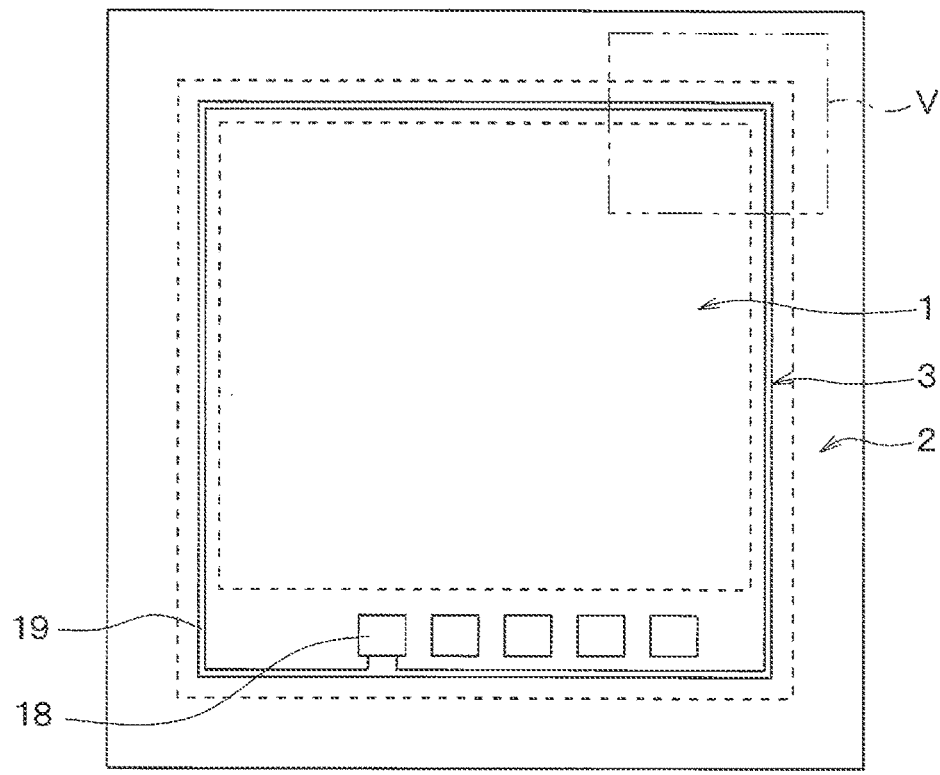
FIG. 1 is a plan view of a semiconductor device according to a first embodiment.

In a conceivable semiconductor device, when a surge current is generated in the semiconductor device, the surge current is discharged through the gate layer and the body layer. For this reason, compared with the case where the body layer is not formed, the surge current flowing through the gate wiring via the gate layer can be reduced.

However, in the conceivable semiconductor device, the gate layer and the body layer have the same configuration. Therefore, when a surge current is generated, the surge current flows substantially equally in the gate layer and the body layer. In this case, since the gate wiring connected to the gate layer is thin (that is, small), the wiring may be broken when the surge current flows therethrogh. That is, the semiconductor device may be broken by the surge current.

A semiconductor device is provided with suppressing the breakdown of the semiconductor device.

According to one aspect of an example embodiment, a semiconductor device in which a JFET is formed, a drift layer having a first conductivity type, a channel layer having the first conductivity type and disposed on the drift layer, a source layer having the first conductivity type, disposed in a surface portion of the channel layer, and an impurity concentration higher than the channel layer, a gate layer having a second conductivity type and arranged in the channel layer deeper than the source layer, a body layer having the second conductivity type and arranged in the channel layer deeper than the source layer, a drain layer arranged opposite to the source layer with the drift layer interposed therebetween, a gate wiring electrically connected to the gate layer, a first electrode electrically connected to the source layer and the body layer, and a second electrode electrically connected to the drain layer.

According to one aspect of an example embodiment, the electric field strength on the bottom side of the body layer is higher than on the bottom side of the gate layer.

According to another aspect of an example embodiment, the body layer has the same impurity concentration and the same width as the gate layer, and is formed deeper than the gate layer.

According to another aspect of an example embodiment, the body layer has the same impurity concentration, the same width and the same depth as the gate layer, and has a bottom with a tapered shape.

According to another aspect of an example embodiment, the body layer has the same impurity concentration, the same width and the same depth as the gate layer. Further, the bottom of the body layer is connected to an impurity region having the first conductivity type with an impurity concentration higher than another impurity region having the first conductivity type and connected to the bottom of the gate layer.

According to another aspect of an example embodiment, the body layer has the same impurity concentration and the same depth as the gate layer, and is narrower in width than the gate layer.

In these semiconductor devices, the electric field strength on the bottom side of the body layer is higher than on the bottom side of the gate layer. Therefore, when a surge occurs, breakdown is more likely to occur on the bottom side of the body layer, and the surge current tends to flow into the body layer. Therefore, a surge current does not easily flow into the gate wiring through the gate layer, and breakdown of the semiconductor device caused by the breakage of the gate wiring is restricted.

Incidentally, reference numerals with parentheses attached to the respective constituent elements and the like indicate an example of a correspondence relationship between the constituent elements and specific constituent elements described in the embodiment described later.

Embodiments of the present disclosure will be described below with reference to the drawings. In the following embodiments, the same reference numerals are assigned to parts that are the same or equivalent to each other for description.

First Embodiment

The first embodiment will be explained. The semiconductor device of the present embodiment, as shown in FIG. 1, has a cell region 1, an outer periphery region 2 surrounding the cell region 1, and an intermediate region 3 which is a region between the cell region 1 and the outer periphery region 2.

Figure 2:
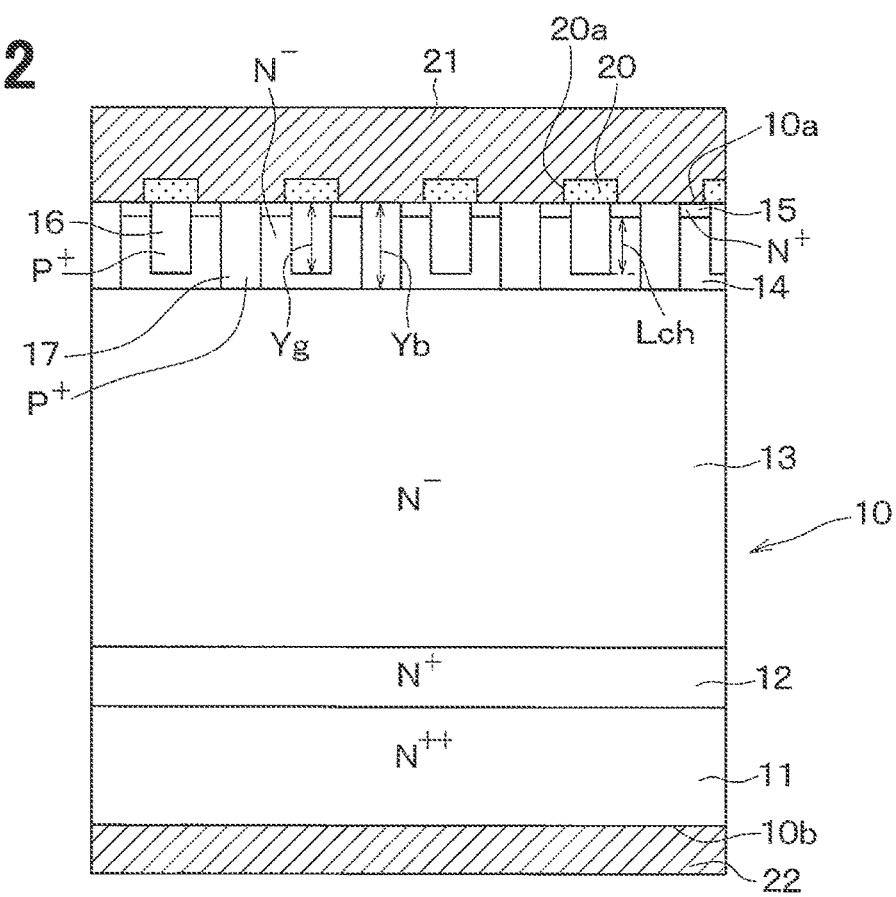
FIG. 2 is a cross-sectional view showing the semiconductor device in the first embodiment, and is a cross-sectional view showing a cell region.
Figure 3:
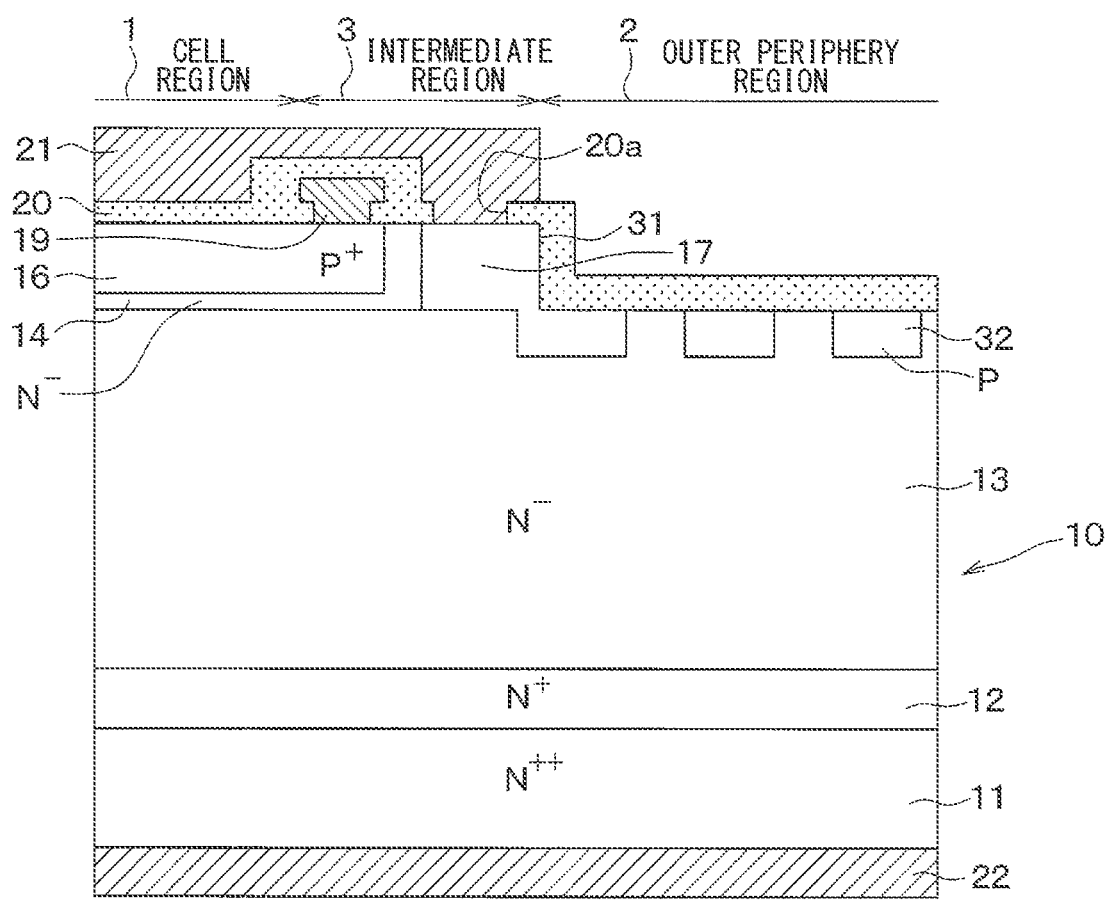
FIG. 3 is a cross-sectional view of a semiconductor device different from FIG. 2, and is a cross-sectional view showing a cell region, an outer periphery region, and an intermediate region.
Figure 4:
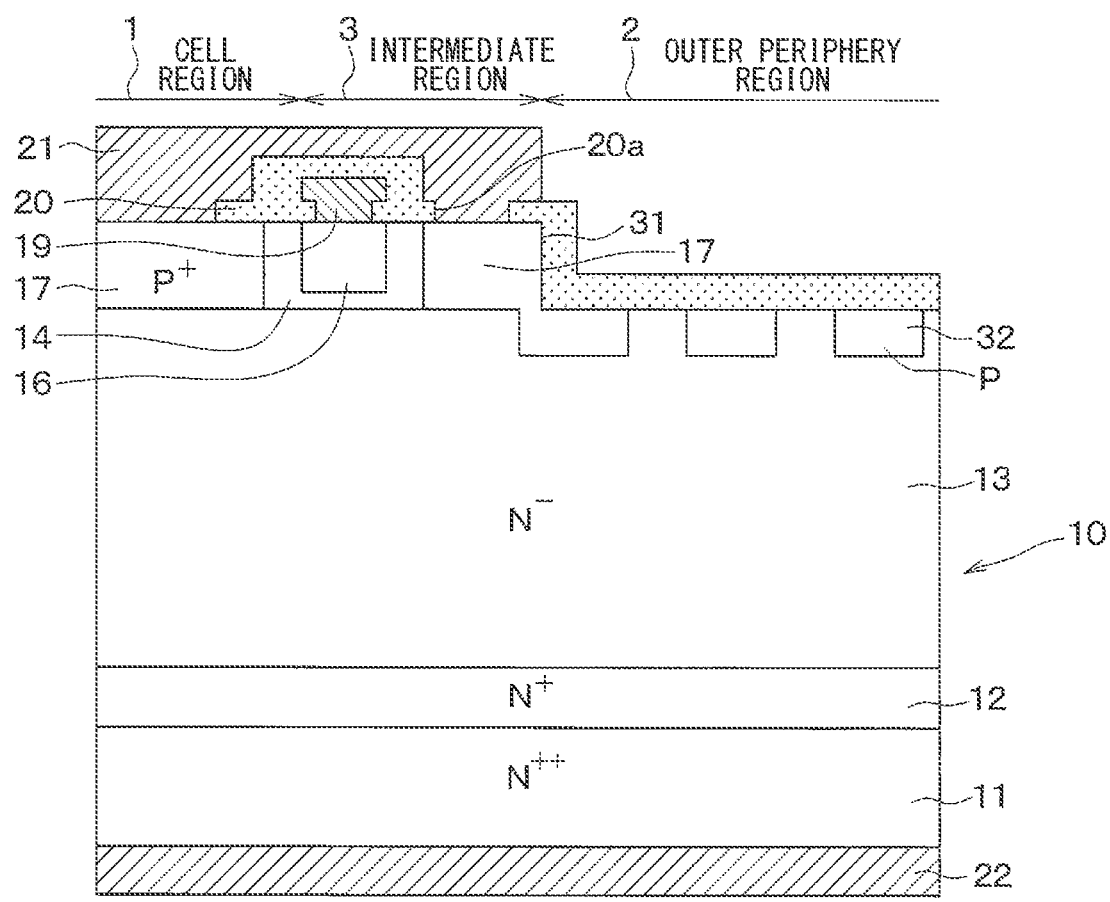
FIG. 4 is a cross-sectional view of a semiconductor device different from FIGS. 2 and 3 and is a cross-sectional view showing a cell region, an outer periphery region, and an intermediate region.

Further, as shown in FIGS. 2 to 4, the semiconductor device includes a semiconductor substrate 10 having a drain layer 11 and formed of an $N^{++}$ type silicon carbide (hereinafter also referred to as "SiC") substrate. Then, an $N^+$ type buffer layer 12 having an impurity concentration lower than that of the drain layer 11 is disposed on the drain layer 11, and an $N^-$ type drift layer 13 having an impurity concentration lower than that of the buffer layer 12 is disposed on the buffer layer 12. Although the buffer layer 12 is arranged to suppress a voltage oscillation at the time of switching in the semiconductor device, the buffer layer 12 may not be arranged. The buffer layer 12 and the drift layer 13 are formed, for example, by growing an epitaxial film made of SiC on the SiC substrate constituting the drain layer 11.

In the cell region 1, the channel layer 14, the source layer 15, the gate layer 16, and the body layer 17 are formed on the side of the surface 10a of the semiconductor substrate 10. Specifically, in the cell region 1, the $N^-$ type channel layer 14 having the same impurity concentration as the drift layer 13 is disposed on the drift layer 13, and an $N^+$ type source layer 15 having an impurity concentration higher than the channel layer 14 is disposed in the surface portion of the channel layer 14. The channel layer 14 is formed, for example, by growing an epitaxial film made of SiC, and the source layer 15 is formed, for example, by ion-implanting an N type impurity and performing heat treatment.

Furthermore, a $P^+$ type gate layer 16 and a $P^+$ type body layer 17 which are higher in impurity concentration than the channel layer 14 are formed so as to penetrate the source layer 15. The gate layer 16 and the body layer 17 are formed, for example, by forming a trench so as to penetrate the source layer 15 and growing an epitaxial film made of SiC so as to be embedded in the trench.

In the present embodiment, the gate layers 16 and the body layers 17 extend in one direction along the surface direction of the semiconductor substrate 10, and are alternately arranged in another direction along the surface direction orthogonal to the extending direction. That is, in FIG. 2, the gate layer 16 and the body layer 17 extend in the direction perpendicular to the drawing surface. The gate layers 16 and the body layers 17 are alternately arranged in the left-right direction on the drawing surface.

In the present embodiment, the gate layer 16 and the body layer 17 have the same impurity concentration and the same width along the arrangement direction. However, the body layer 17 is formed to a deeper position than the gate layer 16. In other words, the body layer 17 protrudes toward the drain layer 11 more than the gate layer 16.

Figure 5:
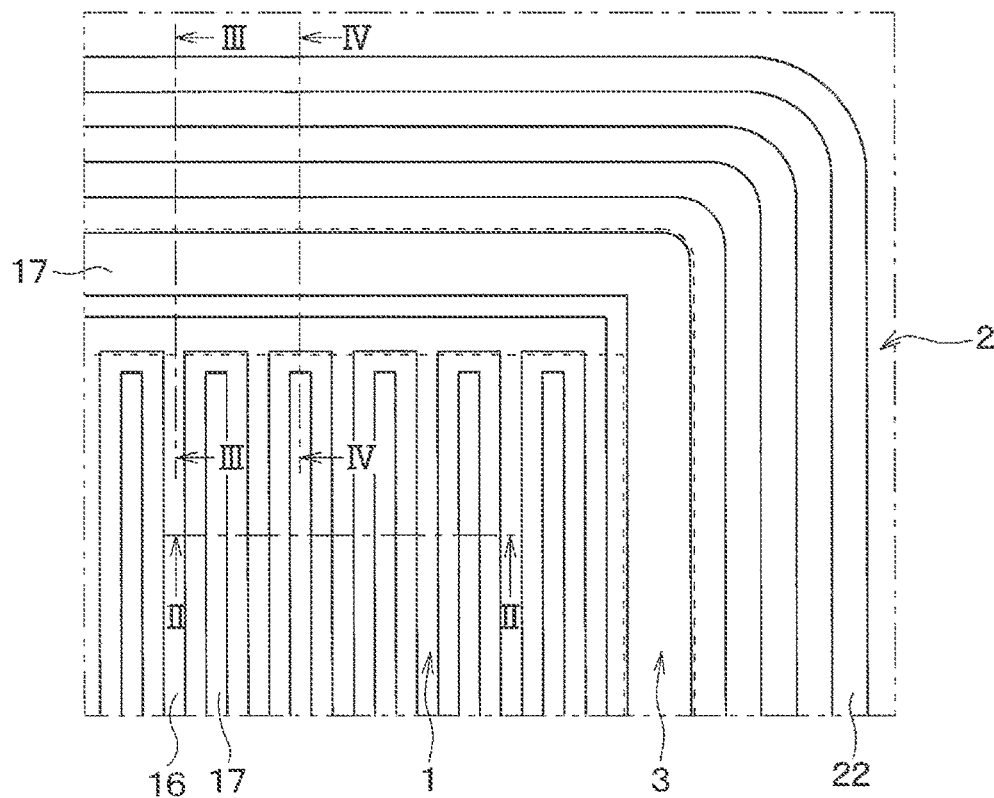
FIG. 5 is an enlarged view of a region V in FIG. 1 and is a schematic plan view showing an arrangement configuration of a gate layer, a body layer, and a guard ring.

Further, in the present embodiment, as shown in FIGS. 3 to 5, the gate layer 16 extends to the intermediate region 3. The gate layer 16 has an annular structure by bending and connecting both ends in the extending direction located in the intermediate region 3, and the annular structures are connected to each other. For this reason, the body layer 17 in FIG. 2 is arranged in a portion on an inner periphery side of the gate layer 16 having the annular structure.

In the present embodiment, as shown in FIGS. 3 and 4, the body layer 17 is also formed in the intermediate region 3, and as described later, the body layer 17 is connected to one of a plurality of guard rings 32 formed in the outer periphery region 2. FIG. 2 is a cross-sectional view taken along the line II-II in FIG. 5, FIG. 3 is a cross-sectional view taken along the line III-III in FIG. 5, and FIG. 4 is a cross-sectional view taken along a line IV-IV in FIG. 5.

Then, as shown in FIG. 1, FIG. 3 and FIG. 4, the gate pad 18 and the gate wiring 19 connecting the gate pad 18 and the gate layer 16 are formed in the intermediate region 3 on the semiconductor substrate 10. Although not shown in the drawing, a temperature sense, a current sense and the like are also formed in the semiconductor device. In the intermediate region 3, pads and wirings electrically connected to various senses not shown are also formed.

Further, as shown in FIGS. 2 to 4, an interlayer insulation film 20 is formed on the surface 10a of the semiconductor substrate 10 so as to cover the gate wiring 19. In the cell region 1 and the intermediate region 3, contact holes 20a for exposing the source layer 15 and the body layer 17 are formed in the interlayer insulation film 20. An upper electrode 21 electrically connected to the source layer 15 and the body layer 17 through the contact hole 20a is formed on the interlayer insulation film 20.

In the present embodiment, the upper electrode 21 corresponds to the first electrode. Further, the upper electrode 21 is formed on the entire surface of the cell region 1 and a part of the intermediate region 3. That is, the upper electrode 21 is formed in a so-called solid shape. For this reason, the cross section of the upper electrode 21 is sufficiently large compared to the gate wiring 19. In other words, the current capacity of the upper electrode 21 is sufficiently larger than that of the gate wiring 19.

A lower electrode 22 electrically connected to the drain layer 11 is formed on the other surface 10b of the semiconductor substrate 10. In the present embodiment, the lower electrode 22 corresponds to the second electrode.

As shown in FIGS. 3 and 4, the outer periphery region 2 is formed into a mesa structure by forming a recess 31, which is prepared by removing a portion corresponding to the channel region 14 in the cell region 1 and the intermediate region 3. A plurality of guard rings 32 having a multiple ring structure surrounding the cell area 1 are formed in the outer periphery area 2. In the present embodiment, one of the plurality of guard rings 32 closest to the cell region 1 is electrically connected to the body layer 17 formed in the intermediate region 3. Alternatively, the one ring 32 may not be electrically connected to the layer 17. In addition, the interlayer insulation film 20 formed in the cell region 1 is also formed in the outer periphery region 2.

The above description is the configuration of the semiconductor device in this embodiment. In the present embodiment, $N^-$ type, N type, $N^+$ type and $N^{++}$ type correspond to the first conductivity type, and $P^+$ type corresponds to the second conductivity type. Further, in the present embodiment, as described above, the semiconductor substrate 10 is configured to include the drain layer 11, the buffer layer 12, the drift layer 13, the channel layer 14, the source layer 15, the gate layer 16, and the body layer 17. Further, in the present embodiment, as described above, the drain layer 11 is formed of a SiC substrate, and the buffer layer 12, the drift layer 13, the channel layer 14 and the like are formed by growing an epitaxial film made of SiC. Therefore, the semiconductor device of the present embodiment may be defined as a SiC semiconductor device.

In such a semiconductor device, when a predetermined gate voltage is not applied to the gate layer 16, the channel layer 14 is pinched off by the depletion layer extending from the gate layer 16. When a gate voltage is applied to gate layer 16 from this state, the depletion layer extending from gate layer 16 is reduced. Thereby, a channel region is formed in the channel layer 14, and current flows through the channel region.

Figure 6:
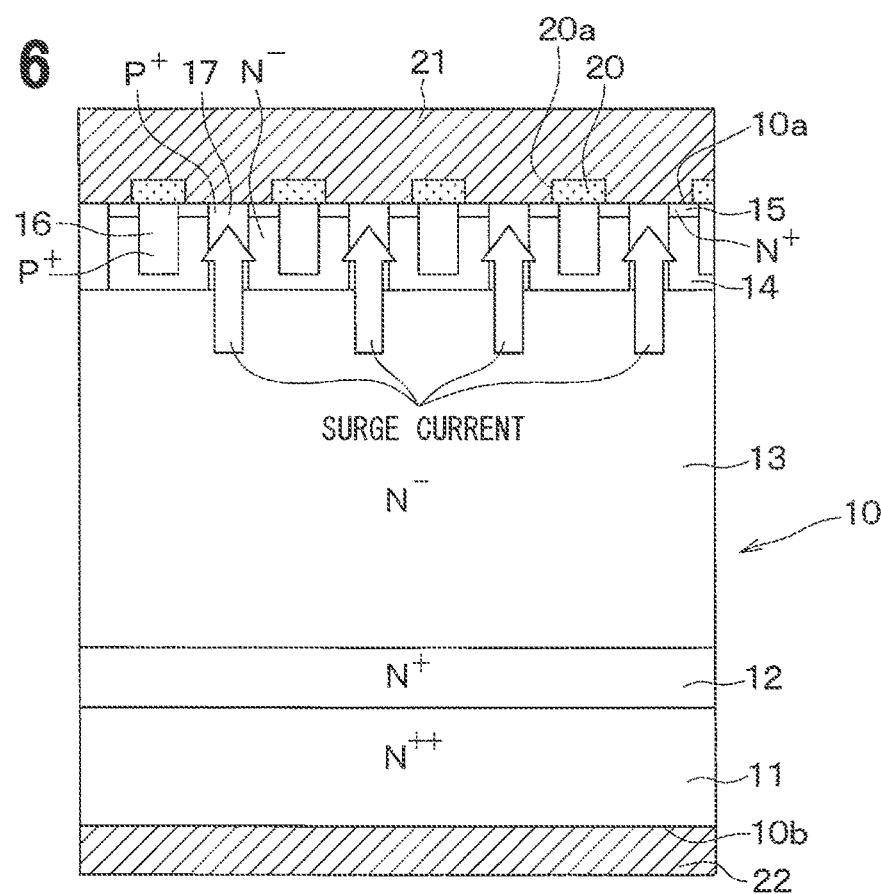
FIG. 6 is a schematic view showing a path through which a surge current flows.

Further, in the present embodiment, the body layer 17 is formed deeper than the gate layer 16. That is, the length of the body layer 17 from the surface 10a to the bottom of the semiconductor substrate 10 is longer than the length of the layer 17 from the surface 10a of the semiconductor substrate 10 to the bottom of the gate layer 16. That is, the body layer 17 protrudes to the drain layer 11 side more than the gate layer 16. For this reason, the electric field strength tends to be higher on the bottom side of the body layer 17 than on the bottom side of the gate layer 16. Therefore, when a surge occurs, breakdown may be likely to occur in the region on the bottom side of body layer 17, as shown in FIG. 6. Thus, the surge current may easily flow into the body layer 17. That is, the surge current hardly flows into the gate layer 16, and the surge current flowing through the gate wiring 19 can be reduced. Therefore, the breakdown of the semiconductor device caused by melting the gate wiring 19 can be suppressed.

The surge current flows into the body layer 17 and then flows into the upper electrode 21. However, the upper electrode 21 is formed in a solid shape and is sufficiently larger than the gate wiring 19. Therefore, even if a large amount of surge current flows into the upper electrode 21, the possibility of the upper electrode 21 being fused is low, and the semiconductor device is not easily broken.

Here, in the semiconductor device including the above-described JFET, the saturation current changes depending on the depth of the gate layer 16. More specifically, the saturation current changes according to the channel length Lch. The surge current increases as the saturation current increases.

Here, the channel length Lch is the length between the source layer 15 and the bottom of the gate layer 16 as shown in FIG. 2. In other words, the channel length Lch is the length of the channel layer 14 in contact with the side surface of the gate layer 16. Therefore, the present inventors examined the relationship between the channel length Lch and the saturation current, and obtained the following results.

Figure 7:
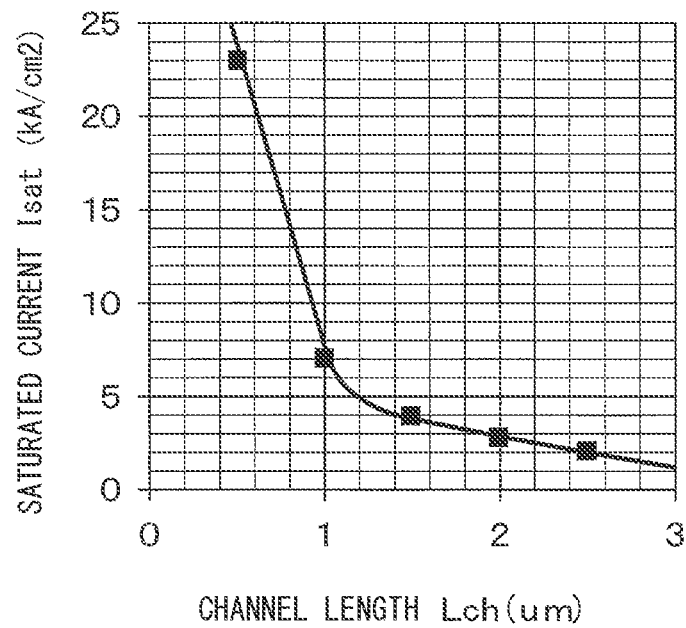
FIG. 7 is a diagram showing simulation results relating to the relationship between a channel length and a saturation current.

That is, as shown in FIG. 7, the saturation current depends on the channel length Lch, and decreases as the channel length Lch increases. Specifically, the saturation current decreases sharply as the channel length Lch increases until the channel length Lch reaches 1 µm. On the other hand, when the channel length Lch is 1 µm or more, the saturation current does not decrease much even when the channel length Lch increases. For this reason, in the present embodiment, the channel length Lch is set to 1 µm or more, and the saturation current is sufficiently reduced. Thus, in the present embodiment, the magnitude of the surge current can be sufficiently reduced.

Further, since the semiconductor device of the present embodiment includes the body layer 17, the withstand voltage changes with respect to the semiconductor device when the body layer 17 is not provided. For this reason, the present inventors also examined the relationship between the depth of the gate layer 16 and the body layer 17 and the breakdown voltage, and obtained the following results. Here, as shown in FIG. 2, the depth of the gate layer 16 is defined as Yg, and the depth of the body layer 17 is defined as Yb. Further, since the length (i.e., the protrusion length) of a portion of the body layer 17 deeper than the gate layer 16 is calculated as "Yb−Yg", the relative protrusion amount indicated by the protrusion length of the body layer 17 with respect to the depth of the gate layer 16 is defined as "dy=(Yb−Yg)/Yg." Then, a prescribed voltage (that is, withstand voltage) required for saturation current is defined as A (for example, 1200 V), a voltage when the relative protrusion amount is changed to reach the saturation current is defined as BV, and a relative voltage difference is defined as "dBV=(BV−A)/A." When the relative voltage difference is a positive value, it indicates that the withstand voltage is increased, and when the relative voltage difference is a negative value, it indicates that the withstand voltage is decreased.

Figure 8:
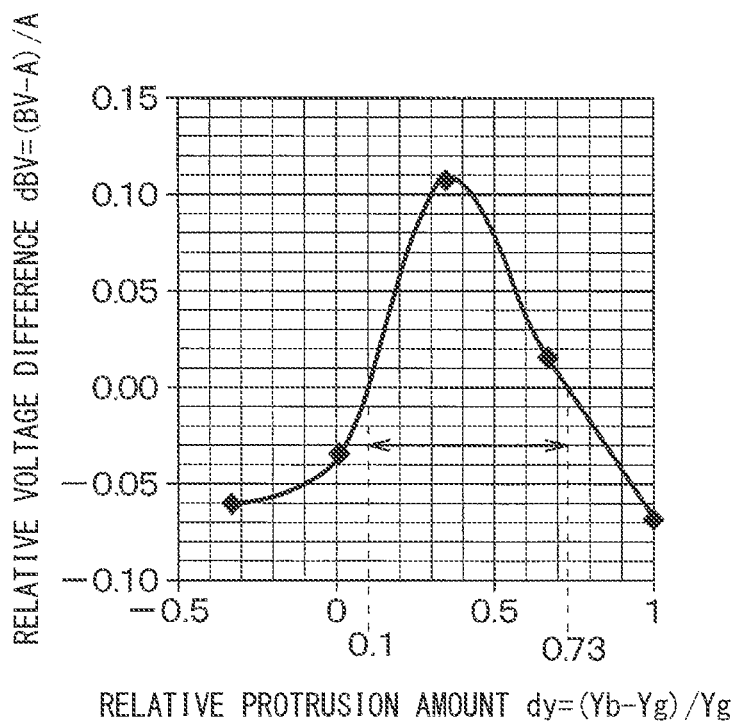
FIG. 8 is a diagram showing simulation results relating to the relationship between the relative protrusion amount and the relative voltage difference.

As shown in FIG. 8, the relative voltage difference has a positive value when the relative protrusion amount is in a range between 0.1 and 0.73. Therefore, in the present embodiment, the depth of the gate layer 16 and the depth of the body layer 17 are set such that the relative protrusion amount has a value between 0.1 and 0.73. Thus, the surge current can easily flow into the body layer 17 while suppressing the decrease in the withstand voltage.

As described above, in the present embodiment, the body layer 17 is formed deeper than the gate layer 16. Therefore, the surge current easily flows into the body layer 17 and hardly flows into the gate layer 16. Therefore, the breakage of the semiconductor device due to the melt-down of the gate wiring 19 is restricted.

Further, in the present embodiment, the channel length Lch is 1 µm or more. As a result, the saturation current can be reduced, and the magnitude of the surge current can be reduced.

Furthermore, the relative protrusion amount of the body layer 17 is in a range between 0.1 and 0.73. For this reason, it is possible to suppress the decrease in the withstand voltage.

Second Embodiment

A second embodiment will be described. The present embodiment is similar to the first embodiment except that the structure of the body layer 17 is modified with respect to the first embodiment, and therefore the description thereof is omitted here.

Figure 9:
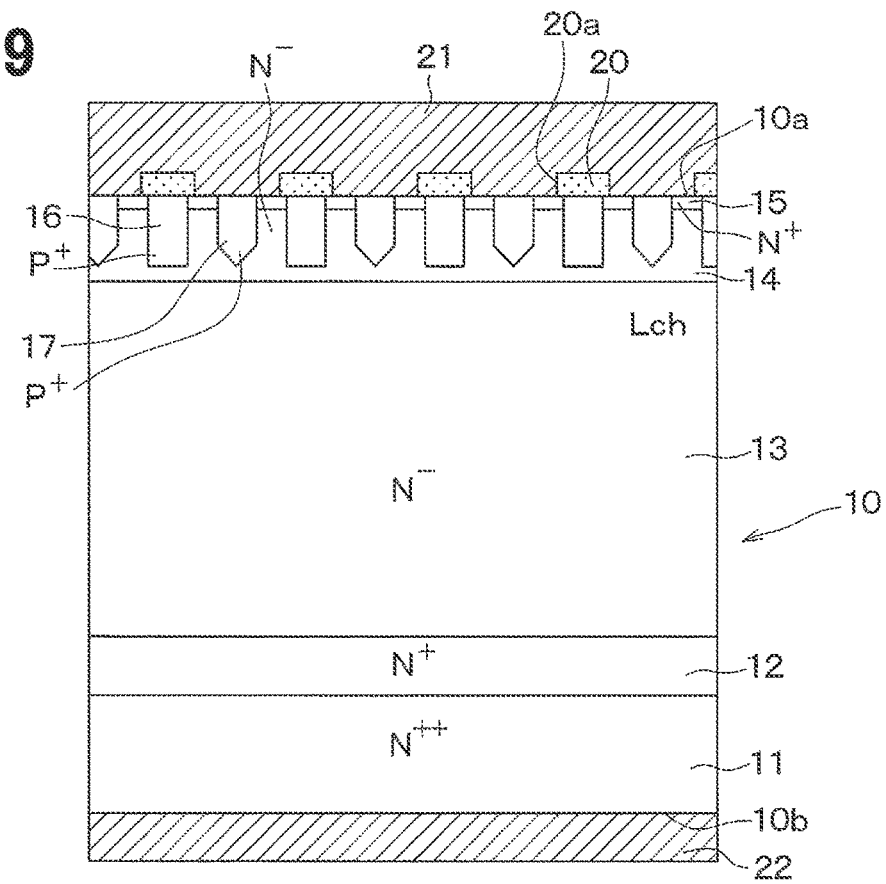
FIG. 9 is a cross-sectional view of a semiconductor device according to a second embodiment.

In the present embodiment, as shown in FIG. 9, the body layer 17 has the same depth as the gate layer 16. However, the bottom of the body layer 17 is tapered. Specifically, in the present embodiment, the bottom of the body layer 17 has a convex shape. That is, the body layer 17 has a sharp bottom shape at the bottom with an acute angle.

Thus, by making the body layer 17 into a tapered shape, the electric field strength on the bottom side of the body layer 17 is likely to be high, and the same effect as that of the first embodiment can be obtained. Here, an example in which the body layer 17 has a pointed bottom shape is described. Alternatively, the tip may be rounded as long as the bottom is tapered.

Third Embodiment

A third embodiment will be described. The present embodiment is similar to the first embodiment except that the configuration of the channel layer 14 is modified with respect to the first embodiment, and the description thereof is omitted here.

Figure 10:
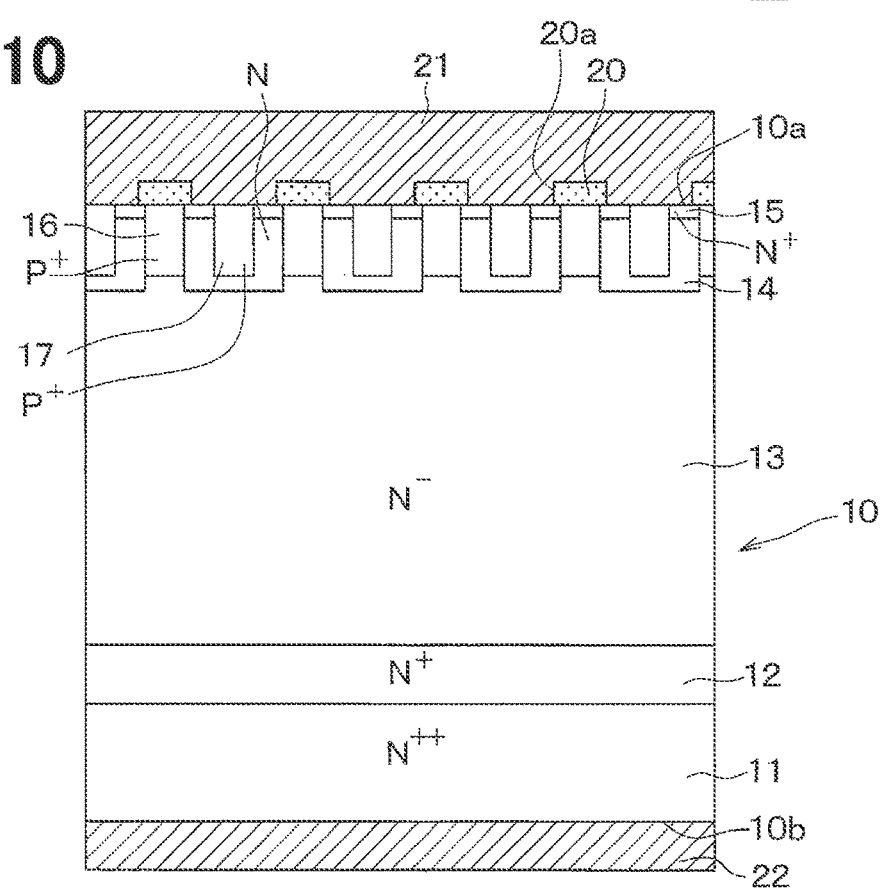
FIG. 10 is a cross-sectional view of a semiconductor device according to a third embodiment.

In the present embodiment, as shown in FIG. 10, the body layer 17 has the same depth as the gate layer 16. The channel layer 14 is not disposed below the gate layer 16. That is, the bottom surface of the gate layer 16 is connected to the drift layer 13.

Further, in the present embodiment, the channel layer 14 has a higher impurity concentration than the drift layer 13. That is, in the present embodiment, since the channel layer 14 has a higher impurity concentration than the drift layer 13, the bottom surface of the body layer 17 has a PN junction with the impurity region having a higher impurity concentration than the bottom surface of the gate layer 16.

According to this, since the channel layer 14 has a higher impurity concentration than the drift layer 13, the depletion layer formed between the body layer 17 and the channel layer 14 is less likely to extend toward the drain layer 11 side than the depletion layer between the gate layer 16 and the drift layer 13. In other words, the depletion layer formed between the gate layer 16 and the drift layer 13 is more easily to extend toward the drain layer 11 side than the depletion layer formed between the body layer 17 and the channel layer 14. Therefore, the electric field strength on the bottom side of the body layer 17 tends to be relatively high, and the same effect as that of the first embodiment can be obtained.

Modification of Third Embodiment

Figure 11:
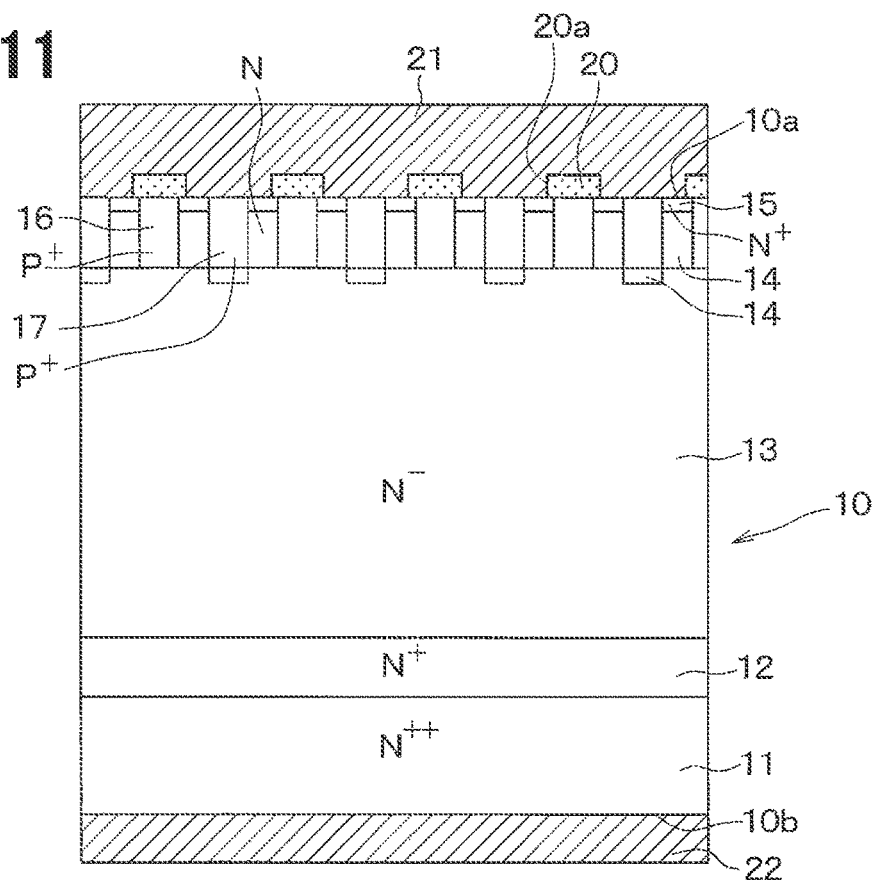
FIG. 11 is a cross-sectional view of a semiconductor device according to a modification of the third embodiment.

The modification of the first embodiment will be described below. As shown in FIG. 11, the channel layer 14 closer to the drift layer 13 than the body layer 17 may be formed to be connected only to the bottom surface of the body layer 17. That is, the channel layer 14 located between the gate layer 16 and the body layer 17 may be made equal to the depth of the gate layer 16 and the depth of the body layer 17. Such a structure also makes it possible to yield the similar advantageous effects as those in the third embodiment.

Fourth Embodiment

A fourth embodiment will be described. In the present embodiment, an N type channel layer is formed to be connected to the bottom surface of the body layer 17 with respect to the first embodiment, and the other features are similar to the first embodiment. Therefore the description thereof is omitted here.

Figure 12:
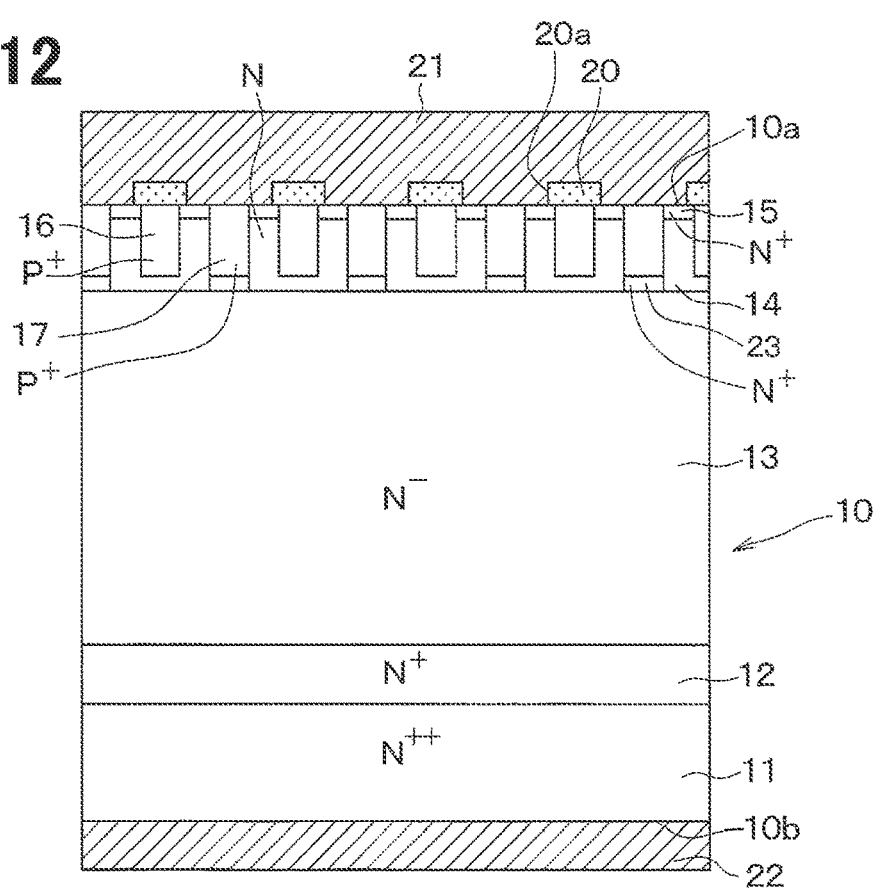
FIG. 12 is a cross-sectional view of a semiconductor device according to a fourth embodiment.

In the present embodiment, as shown in FIG. 12, the body layer 17 has the same depth as the gate layer 16. Further, in the channel layer 14, an $N^+$ type channel layer 23 having a higher impurity concentration than the channel layer 14 is formed so as to be connected to the bottom surface of the body layer 17. That is, in the present embodiment, since the $N^+$ type channel layer 23 has a higher impurity concentration than the channel layer 14, the bottom surface of the P type body layer 17 has a PN junction with an impurity region higher in impurity concentration than the bottom surface of the gate layer 16.

According to this, the N type channel layer 23 has a higher impurity concentration than the channel layer 14. Therefore, the depletion layer formed between the P type body layer 17 and the N type channel layer 23 is less likely to extend toward the drain layer 11 than the depletion layer formed between the gate layer 16 and the channel layer 14. In other words, the depletion layer formed between the gate layer 16 and the channel layer 14 is more easily to extend toward the drain layer 11 side than the depletion layer formed between the body layer 17 and the channel layer 23. Therefore, the electric field strength on the bottom side of the body layer 17 tends to be relatively high, and the same effect as that of the first embodiment can be obtained.

Fifth Embodiment

A fifth embodiment will be described. The present embodiment is similar to the first embodiment except that the width of the body layer 17 is narrowed with respect to the first embodiment, and therefore the description thereof is omitted here.

Figure 13:
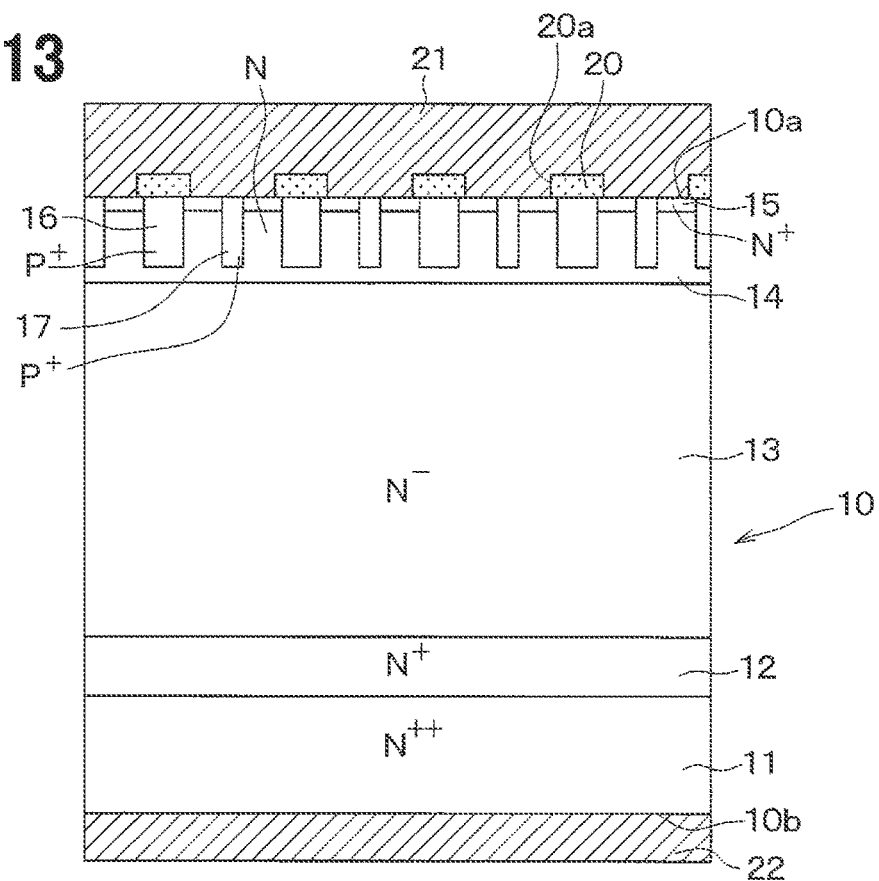
FIG. 13 is a cross-sectional view of a semiconductor device according to a fifth embodiment.

In the present embodiment, as shown in FIG. 13, the body layer 17 has the same depth as that of the gate layer 16 but the width of the layer 17 is narrower than the gate layer 16. Even in such a semiconductor device, by making the width of the body layer 17 narrower than the width of the gate layer 16, the electric field strength on the bottom side of the body layer 17 tends to be high, and similar effects as the first embodiment are obtained.

Sixth Embodiment

A sixth embodiment will be described hereafter. The present embodiment is the same as the first embodiment except that a shield layer is added to the first embodiment, and therefore the description is omitted here.

Figure 14:
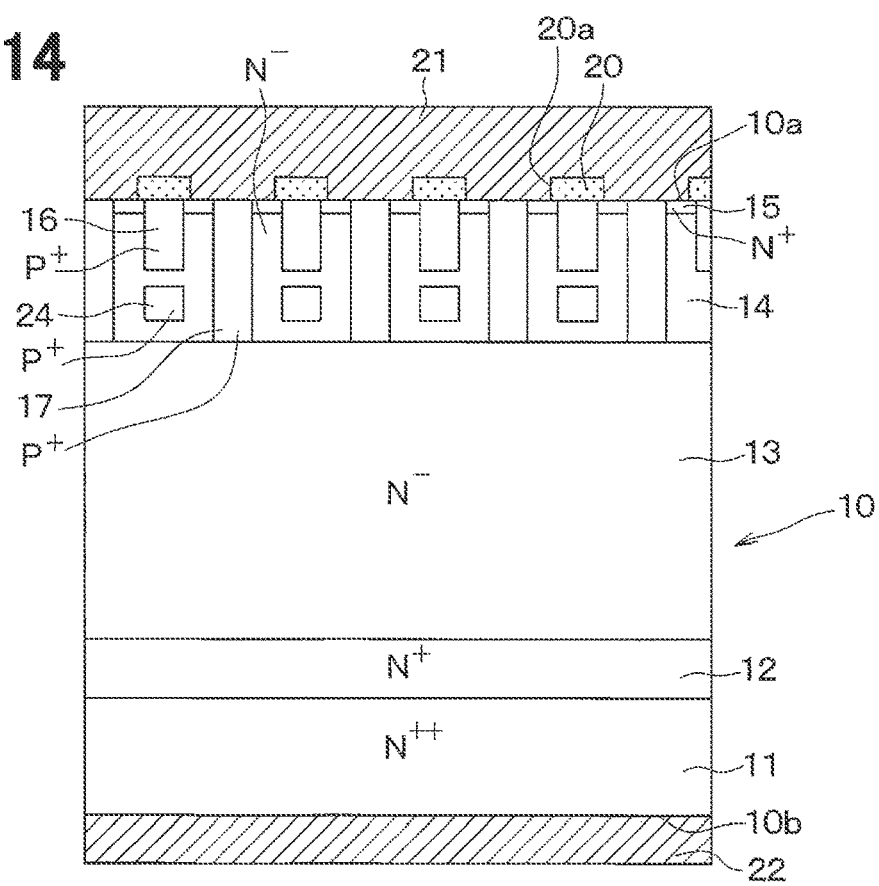
FIG. 14 is a cross-sectional view of a semiconductor device according to a sixth embodiment.
Figure 15:
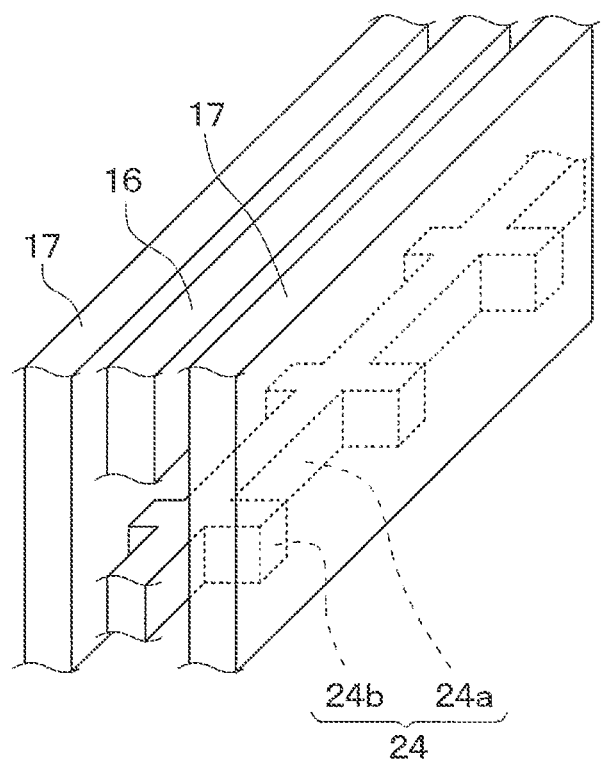
FIG. 15 is a perspective view of a gate layer, a body layer, and a shield layer in FIG. 14.

In the present embodiment, as shown in FIGS. 14 and 15, a $P^+$ type shield layer 24 having an impurity concentration equivalent to that of the body layer 17 is formed below the gate layer 16 in the channel layer 14.

Specifically, the shield layer 24 has a main portion 24a extending along the extending direction of the gate layer 16 and the body layer 17. Also, the shield layer 24 has a protrusion 24b extending from the main portion 24a in the surface direction of the semiconductor substrate 10 intersecting with the extending direction of the main portion 24a. The protrusion 24b of the shield layer 24 is connected to the body layer 17.

In the present embodiment, a plurality of protrusions 24b are provided so as to protrude from both sides of the main portion 24a, and are periodically formed along the extending direction. That is, the shield layer 24 is connected to the adjacent body layer 17 through the plurality of protrusions 24b.

The above description is the configuration of the semiconductor device in this embodiment. Next, a method of manufacturing the semiconductor device of the present embodiment will be described with reference to FIGS. 16A to 16G.

Figure 16A:
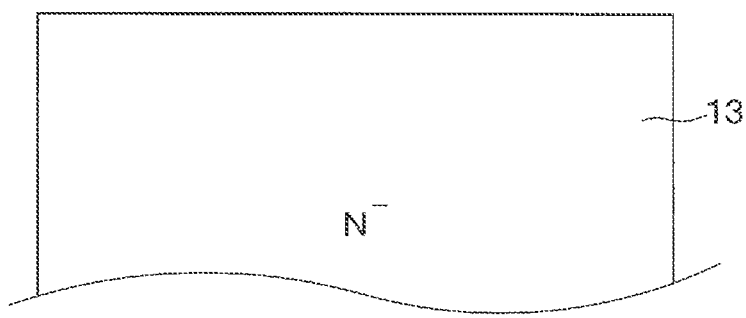
FIG. 16A is a view showing a manufacturing process of the semiconductor device shown in FIG. 14.

First, as shown in FIG. 16A, a substrate on which the drain layer 11, the buffer layer 12, and the drift layer 13 are formed is prepared. In FIG. 16A, the drain layer 11 and the buffer layer 12 located below the drift layer 13 are not shown. Also in FIGS. 16B to 16G described later, the drain layer 11 and the buffer layer 12 located below the drift layer 13 are not shown.

Figure 16B:
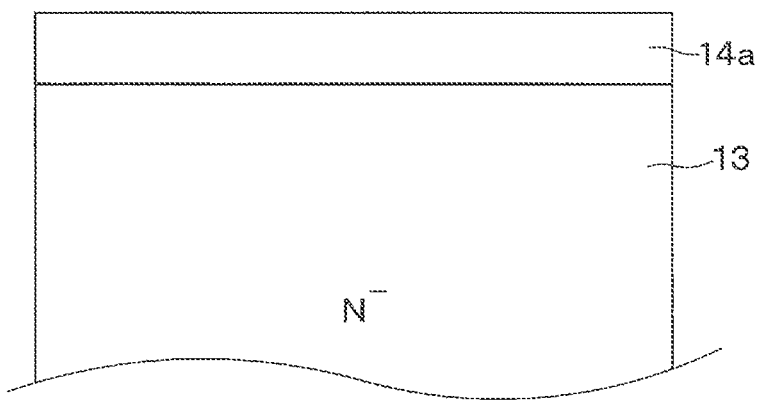
FIG. 16B is a view showing the manufacturing process of the semiconductor device subsequent to FIG. 16A.

Then, as shown in FIG. 16B, an epitaxial film made of, for example, SiC is grown on the drift layer 13 to form the lower channel layer 14a that constitutes the lower layer side of the channel layer 14. In the present embodiment, the thickness of the lower layer channel layer 14a is equal to a distance between the drift layer 13 and the bottom surface of the gate layer 16.

Figure 16C:
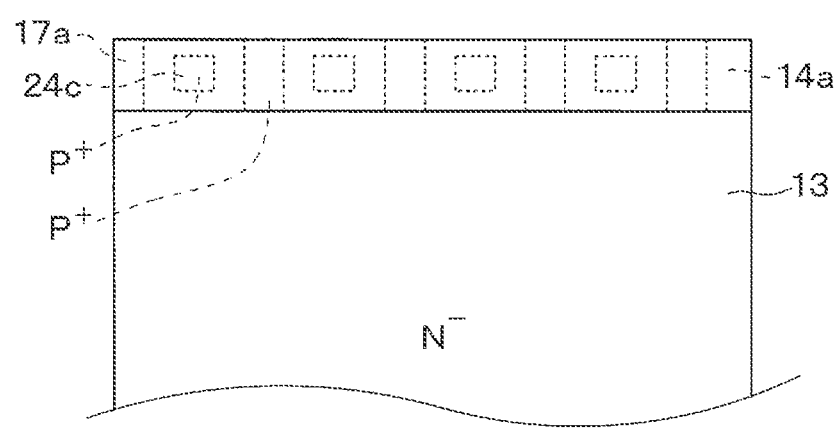
FIG. 16C is a view showing the manufacturing process of the semiconductor device subsequent to FIG. 16B.

Subsequently, as shown in FIG. 16C, a mask not shown is formed on the lower layer channel layer 14a, and a P type impurity is ion-implanted into the lower layer channel layer 14a. Then, in the lower layer channel layer 14a, the body layer injection region 17a and the shield layer injection region 24c are formed on the lower layer side. At this time, the mask and the acceleration voltage during ion implantation are appropriately controlled so that the body layer implantation region 17a is formed to reach the surface side of the lower layer channel layer 14a, and the shield layer implantation region 24c is separated from the surface of the lower layer channel layer 14a.

The body layer injection region 17a on the lower layer side is a region which provides a lower layer side portion of the body layer 17 by heat treatment to activate the impurity.

The shield layer implantation region 24c is a region in which the shield layer 24 is formed by heat treatment to activate the impurity. In addition, the shield layer injection region 24c is formed such that the main portion 24a and the protrusion 24b are formed when the shield layer 24 is formed.

Figure 16D:
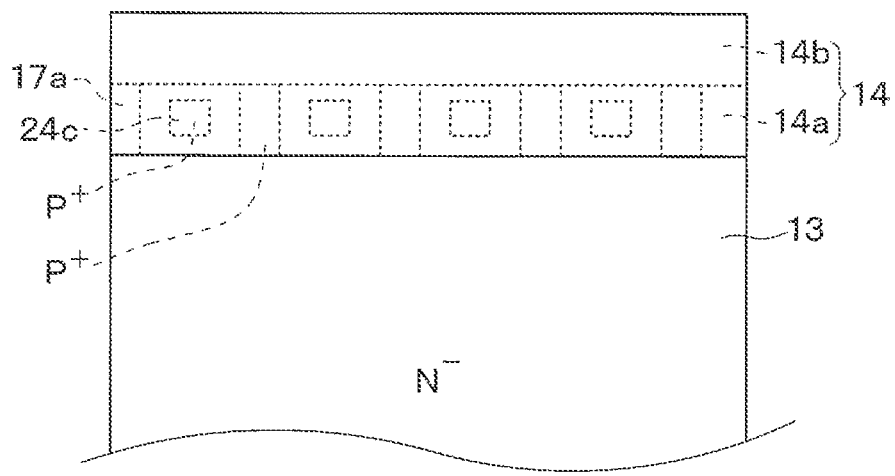
FIG. 16D is a view showing the manufacturing process of the semiconductor device subsequent to FIG. 16C.

Next, as shown in FIG. 16D, the upper channel layer 14b is formed by again growing an epitaxial film made of SiC on the lower channel layer 14a. Thus, the channel layer 14 is configured.

Figure 16E:
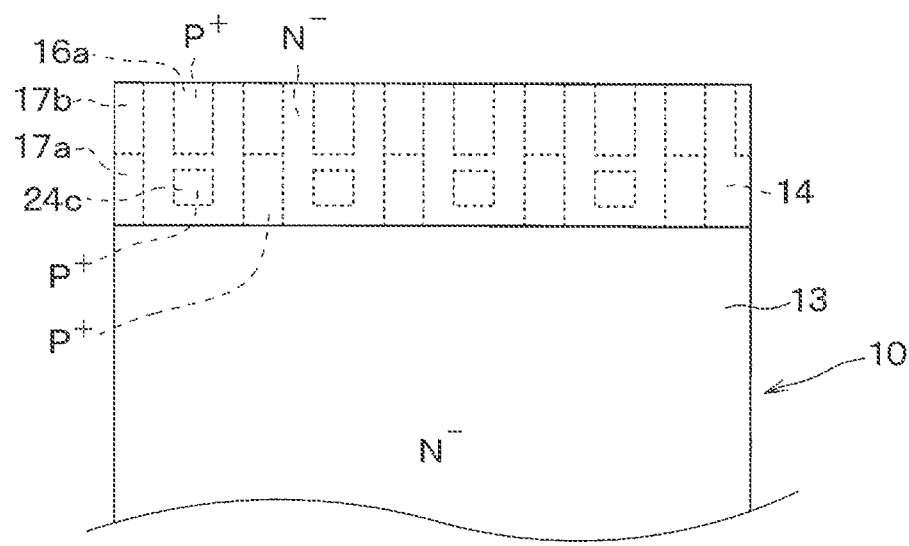
FIG. 16E is a view showing the manufacturing process of the semiconductor device subsequent to FIG. 16D.

Subsequently, as shown in FIG. 16E, a mask (not shown) is formed on the channel layer 14 and a P type impurity is ion-implanted into the channel layer 14. Then, the body layer injection region 17b on the upper layer side is formed on the body region injection region 17a on the lower layer side, and the gate layer injection region 16a is formed on the shield layer injection region 24c. In the present embodiment, the upper layer side body layer implantation region 17b and the gate layer implantation region 16a have the same depth, and these are simultaneously formed. The body layer injection region 17a on the upper layer side is a region which provides an upper layer side portion of the body layer 17 by heat treatment to activate the impurity. The gate layer implantation region 16a is a region where the gate layer 16 is formed by heat treatment to activate the impurity.

Figure 16F:
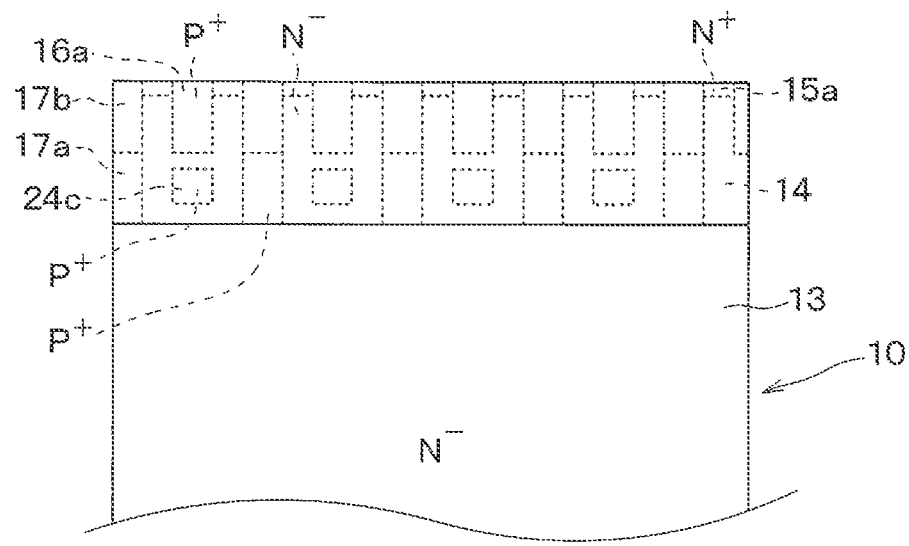
FIG. 16F is a view showing the manufacturing process of the semiconductor device subsequent to FIG. 16E.

Thereafter, as shown in FIG. 16F, the mask on the channel layer 14 is changed, and an N type impurity is ion-implanted into the channel layer 14 to form a source layer implantation region 15a. The source layer implantation region 15a is a region where the source layer 15 is formed by heat treatment to activate the impurity.

Figure 16G:
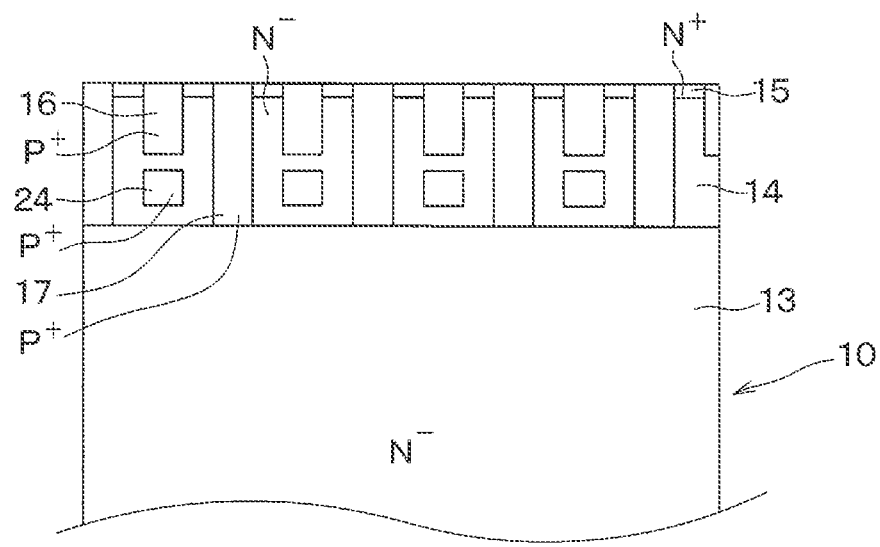
FIG. 16G is a view showing the manufacturing process of the semiconductor device subsequent to FIG. 16F.

Subsequently, as shown in FIG. 16G, heat treatment is performed to activate the impurity, whereby the source layer 15, the gate layer 16, the body layer 17, and the shield layer 24 are formed. After that, although not particularly shown, the semiconductor device shown in FIG. 14 is manufactured by appropriately forming the upper electrode 21 and the lower electrode 22 and the like.

As described above, in the present embodiment, the shield layer 24 connected to the body layer 17 is formed below the gate layer 16. Therefore, in the semiconductor device, the surge current can be further suppressed from flowing into the gate layer 16.

Figure 17:
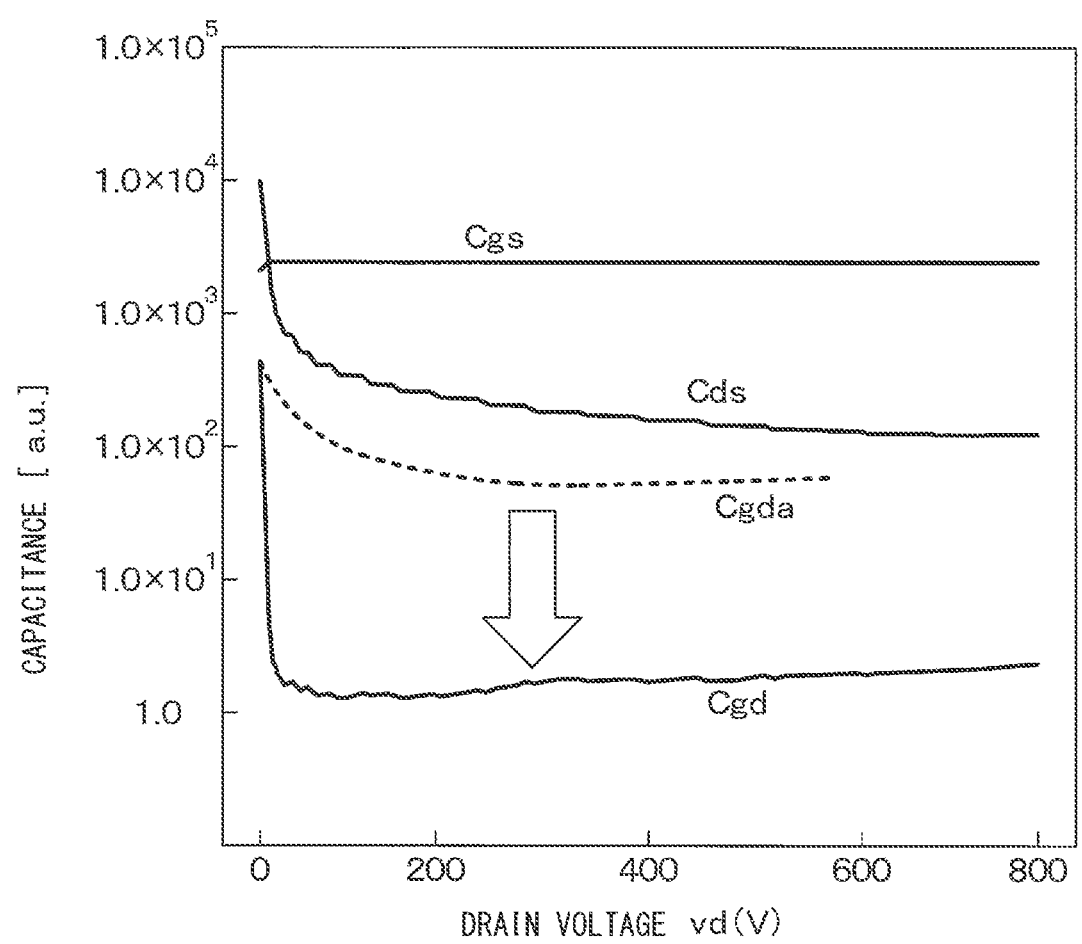
FIG. 17 is a diagram showing capacitances of the semiconductor device shown in FIG. 14.

Further, in the present embodiment, the shield layer 24 connected to the body layer 17 is disposed below the gate layer 16. Therefore, the capacitance Cgd between the gate and the drain can be reduced, and the switching loss can also be reduced. Specifically, as shown in FIG. 17, by forming the shield layer 24, the capacitance Cgd between the gate and the drain is reduced by one or more than one digit, compared with the capacitance Cgda between the gate and the drain when the shield layer 24 is not formed. The value of Cgs in FIG. 17 indicates the gate-source capacitance, and the value of Cds indicates the drain-source capacitance.

Furthermore, in the present embodiment, in the shield layer 24, the protrusions 24b are periodically formed along the extending direction of the main portion 24a. Each protrusion 24b of the shield layer 24 is connected to the body layer 17. For this reason, for example, compared with the case where the shield layer 24 is connected to the body layer 17 only partially, it is possible to suppress the potential of the shield layer 24 from becoming unstable.

Other Embodiments

Although the present disclosure has been described in accordance with the embodiments, it is understood that the present disclosure is not limited to such embodiments or structures. The present disclosure encompasses various modifications and variations within the scope of equivalents. In addition, various combinations and forms, and further, other combinations and forms including only one element, or more or less than these elements are also within the scope and the scope of the present disclosure.

For example, in each of the above-mentioned embodiments, the example is described in which the first conductive type is N type and the second conductive type is P type. Alternatively, the first conductive type may be P type and the second conductive type may be N type.

Moreover, each embodiment may be combined. For example, the first embodiment may be combined with the second to fifth embodiments to make the body layer 17 deeper than the gate layer 16. The second embodiment may be combined with the third to sixth embodiments to make the bottom of the body layer 17 tapered. Furthermore, by combining the third embodiment with the fourth to sixth embodiments, the channel layer 14 may be configured to have a higher impurity concentration than the drift layer 13, and the channel layer 14 may not be disposed under the gate layer 16. In this case, the shield layer 24 is formed on the drift layer 13 when the third embodiment is combined with the sixth embodiment. Alternatively, the fourth embodiment may be combined with the fifth and sixth embodiments, and the N type channel layer 23 may be arranged under the P type body layer 17. Furthermore, the fifth embodiment may be combined with the sixth embodiment, and the width of the body layer 17 may be narrower than the width of the gate layer 16. And the combinations of each embodiment may be combined further.

Furthermore, in each of the above embodiments, the gate layers 16 and the body layers 17 may not be alternately formed in the direction orthogonal to the extending direction. For example, the body layer 17 may be formed between the plurality of gate layers 16, and the gate layer 16 may be formed between the plurality of body layers 17. Moreover, each of a part of the gate layers 16 and a part of the body layers 17 may be grouped together and arranged. Furthermore, only one body layer 17 may be provided. Even with such a configuration, when the electric field strength is higher on the bottom side of the body layer 17 than on the bottom side of the gate layer 16, the surge current can easily flow into the body layer 17. However, it is preferable that the gate layers 16 and the body layers 17 may be alternately arranged, because the surge current does not easily flow into the gate layers 16. In the case of such a configuration, in the sixth embodiment, the shield layer 24 is formed to be connected to the adjacent body layer 17 below the gate layer 16.

And in each above-described embodiment, the gate layer 16 and the body layer 17 may be made into different impurity concentrations. Even with such a configuration, when the electric field strength is higher on the bottom side of the body layer 17 than on the bottom side of the gate layer 16, the surge current can easily flow into the body layer 17.

In each of the above embodiments, the vertical semiconductor device in which the current flows in the thickness direction of the semiconductor substrate 10 has been described. Alternatively, each of the above embodiments may be applied to a lateral semiconductor device in which current flows in the planar direction of the semiconductor substrate 10.

Furthermore, in the above embodiments, the semiconductor device including the normally-off JFET has been described. Alternatively, the configuration of each of the above embodiments can also be applied to a semiconductor device provided with a normally-on JFET.

In each of the above embodiments, the SiC semiconductor device has been described as an example. Alternatively, another compound semiconductor device or a semiconductor device formed by hetero-epitaxy growth on a silicon substrate may be used.

Furthermore, in the sixth embodiment, as long as the shield layer 24 is connected to the body layer 17, for example, the protrusion 24b may be disposed only on one side of the main portion 24a, and the protrusion 24b may not be formed periodically along the extending direction of the main portion 24a.

In the sixth embodiment, the depth of the shield layer 24 may be equal to the depth of the body layer 17 or may be deeper than the body layer 17. The shield layer 24 maintains a function for protecting the gate layer 16 by connecting with the body layer 17. Alternatively, the shield layer 24 may not have the same impurity concentration as the body layer 17.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor device in which a junction type FET is arranged, the semiconductor device comprising:
   a semiconductor substrate having a cell region in which the junction type FET is arranged and an outside of the cell region, wherein:
   the cell region includes:
     a drift layer having a first conductivity type;
     a channel layer having the first conductivity type and disposed on the drift layer;
     a source layer having the first conductivity type with an impurity concentration higher than the channel layer and arranged in a surface portion of the channel layer;
     a gate layer having a second conductivity type and arranged in the channel layer;
     a body layer having the second conductivity type and arranged in the channel layer to be deeper than the source layer;
     a drain layer disposed on an opposite side of the source layer with respect to the drift layer sandwiched therebetween;
     a gate wiring electrically connected to the gate layer;
     a first electrode electrically connected to the source layer and the body layer; and
     a second electrode electrically connected to the drain layer;
   the gate layer is disposed in another surface portion of the channel layer opposite to the drift layer;
   the body layer is further disposed on the outside of the cell region;
   an electric field strength is higher on a bottom side of the body layer than on a bottom side of the gate layer;
   the gate layer extends from a surface of the channel layer to a predetermined depth of the channel layer;
   the predetermined depth of the channel layer is deeper than a bottom of the source layer;

a portion of the body layer is located on an inner peripheral side of the gate layer, the body layer being electrically connected to one of a plurality of guard rings in an outer periphery of the cell region; and the one of the plurality of the guard rings has a bottom surface that is lower than a bottom surface of the body layer.

2. The semiconductor device according to claim 1, wherein:

the body layer is deeper than the gate layer.

3. The semiconductor device according to claim 2, wherein:

a depth of the gate layer is defined as Yg;

a depth of the body layer is defined as Yb;

a relative protrusion amount indicates a ratio of a length of a part of the body layer deeper than the gate layer with respect to the depth of the gate layer;

the relative protrusion amount is defined as (Yb-Yg)/Yg; and the relative protrusion amount is in a range between 0.1 and 0.73.

4. The semiconductor device according to claim 2, wherein:

a shield layer having the second conductivity type is arranged below the gate layer; and the shield layer is connected to the body layer and spaced apart from the gate layer.

5. The semiconductor device according to claim 4, wherein:

the gate layer and the body layer extend in one direction, the shield layer has a main portion extending along the one direction and a plurality of protrusions protruding in a direction intersecting with the main portion and periodically arranged along the one direction; and the plurality of protrusions are connected to the body layer.

6. The semiconductor device according to claim 1, wherein:

the body layer is tapered at a bottom of the body layer.

7. The semiconductor device according to claim 1, wherein:

a bottom surface of the body layer is connected to an impurity region having the first conductivity type with an impurity concentration higher than another impurity region having the first conductivity type and connected to a bottom surface of the gate layer.

8. The semiconductor device according to claim 7, wherein:

the channel layer has an impurity concentration higher than the drift layer;

a bottom surface of the gate layer is connected to the drift layer; and a bottom surface of the body layer is connected to the channel layer.

9. The semiconductor device according to claim 7, wherein:

another channel layer having the first conductivity type is arranged in the channel layer, has an impurity concentration higher than the channel layer, and is connected to a bottom surface of the body layer.

10. The semiconductor device according to claim 1, wherein:

a width of the body layer is narrower than the gate layer.

11. The semiconductor device according to claim 1, wherein:

the channel layer has a channel length between the source layer and a bottom surface of the gate layer; and the channel length is equal to or longer than 1 μm.

12. The semiconductor device according to claim 1, wherein:

the drain layer, the drift layer, the channel layer, the source layer, the gate layer, and the body layer are made of silicon carbide.

13. The semiconductor device according to claim 1, wherein:

an impurity concentration of the channel layer is higher than an impurity concentration of the drift layer.

14. The semiconductor device according to claim 1, wherein the gate layer penetrates the source layer; and the gate layer is exposed from a surface of the channel layer.

15. The semiconductor device according to claim 1, wherein:

sidewalls of the body layer are continuously straight.

16. The semiconductor device according to claim 1, wherein an entire surface of the source layer faces a surface of the drift layer.

17. A semiconductor device in which a junction type FET is formed, the semiconductor device comprising:

a semiconductor substrate having a cell region in which the junction type FET is arranged and an outside of the cell region, wherein:

the cell region includes:

a drift layer having a first conductivity type;

a channel layer having the first conductivity type and disposed on the drift layer;

a source layer having the first conductivity type with an impurity concentration higher than the channel layer and arranged in a surface portion of the channel layer;

a gate layer having a second conductivity type and arranged in the channel layer;

a body layer having the second conductivity type and arranged in the channel layer to be deeper than the source layer;

a drain layer disposed on an opposite side of the source layer with respect to the drift layer sandwiched therebetween;

a gate wiring electrically connected to the gate layer;

a first electrode electrically connected to the source layer and the body layer; and a second electrode electrically connected to the drain layer;

the gate layer is disposed in another surface portion of the channel layer opposite to the drift layer;

the body layer is further disposed on the outside of the cell region;

the body layer has a same impurity concentration and a same width as the gate layer;

the body layer is arranged deeper than the gate layer;

the gate layer extends from a surface of the channel layer to a predetermined depth of the channel layer;

the predetermined depth of the channel layer is deeper than a bottom of the source layer;

a portion of the body layer is located on an inner peripheral side of the gate layer, the body layer being electrically connected to one of a plurality of guard rings in an outer periphery of the cell region; and the one of the plurality of the guard rings has a bottom surface that is lower than a bottom surface of the body layer.

18. The semiconductor device according to claim 17, wherein:
   the drain layer, the drift layer, the channel layer, the source layer, the gate layer, and the body layer are made of silicon carbide.

19. The semiconductor device according to claim 17, wherein:
   an impurity concentration of the channel layer is higher than an impurity concentration of the drift layer.

20. The semiconductor device according to claim 17, wherein
   the gate layer penetrates the source layer; and
   the gate layer is exposed from a surface of the channel layer.

* * * * *